(12) United States Patent
Matsushita et al.

(10) Patent No.: US 8,664,632 B2
(45) Date of Patent: Mar. 4, 2014

(54) MEMORY DEVICE

(75) Inventors: Daisuke Matsushita, Kanagawa-ken (JP); Shosuke Fujii, Kanagawa-ken (JP); Yoshifumi Nishi, Kanagawa-ken (JP); Akira Takashima, Tokyo (JP); Takayuki Ishikawa, Kanagawa-ken (JP); Hidenori Miyagawa, Kanagawa-ken (JP); Takashi Haimoto, Tokyo (JP); Yusuke Arayashiki, Kanagawa-ken (JP); Hideki Inokuma, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/599,504

(22) Filed: Aug. 30, 2012

(65) Prior Publication Data
US 2013/0228736 A1 Sep. 5, 2013

(30) Foreign Application Priority Data

Jan. 31, 2012 (JP) ................................. 2012-018006
Mar. 22, 2012 (JP) ................................. 2012-066109

(51) Int. Cl.
*H01L 47/00* (2006.01)
*G11C 11/00* (2006.01)

(52) U.S. Cl.
USPC ............... 257/4; 257/655; 365/148; 365/164; 438/510

(58) Field of Classification Search
None
See application file for complete search history.

(56) References Cited

U.S. PATENT DOCUMENTS

| | | | | |
|---|---|---|---|---|
| 8,431,920 | B2* | 4/2013 | Kamata et al. ................. | 257/4 |
| 2011/0062407 | A1* | 3/2011 | Kamata et al. ................. | 257/4 |
| 2011/0305064 | A1* | 12/2011 | Jo et al. ........................ | 365/148 |
| 2012/0007035 | A1* | 1/2012 | Jo et al. ........................ | 257/4 |

OTHER PUBLICATIONS

Sung Hyun Jo et al., "CMOS Compatible Nanoscale Nonvolatile Resistance Switching Memory", NANO Letters, vol. 8, No. 2, 2008, pp. 392-397.

* cited by examiner

*Primary Examiner* — Andres Munoz
(74) *Attorney, Agent, or Firm* — Oblon, Spivak, McClelland, Maier & Neustadt, L.L.P.

(57) ABSTRACT

According to one embodiment, a memory device includes a first electrode, a second electrode, and a variable resistance film. The variable resistance film is connected between the first electrode and the second electrode. The first electrode includes a metal contained in a matrix made of a conductive material. A cohesive energy of the metal is lower than a cohesive energy of the conductive material. A concentration of the metal at a central portion of the first electrode in a width direction thereof is higher than concentrations of the metal in two end portions of the first electrode in the width direction.

18 Claims, 14 Drawing Sheets

| | | ION SOURCE METAL | | | | | | | | | | |
|---|---|---|---|---|---|---|---|---|---|---|---|---|
| | | Li | Cr | Fe | Cu | In | Te | Ca | Na | Ag | Co | Au |
| MATRIX MATERIAL | W | O | O | O | O | O | O | O | O | O | O | O |
| | Mo | O | O | O | O | O | O | O | O | O | O | O |
| | Ti | O | O | O | O | O | O | O | O | O | O | O |
| | Cr | O | × | × | × | × | × | O | O | O | × | × |
| | Ta | O | O | O | O | O | O | O | O | O | O | O |
| | Ni | O | × | × | O | × | × | O | O | O | × | × |

MEMORY DEVICE

CROSS-REFERENCE TO RELATED APPLICATIONS

This application is based upon and claims the benefit of priority from the prior Japanese Patent Application No. 2012-018006, filed on Jan. 31, 2012, and the prior Japanese Patent Application No. 2012-066109, filed on Mar. 22, 2012; the entire contents of which are incorporated herein by reference.

FIELD

Embodiments described herein relate generally to a memory device.

BACKGROUND

A resistance random access memory (ReRAM) is drawing attention and being developed as a memory to replace DRAM (Dynamic Random Access Memory) and flash memory. The cell structure of ReRAM is a simple capacitor structure in which a variable resistance film is interposed between two metal electrodes; and information can be stored by changing the resistance of the variable resistance film with an on/off ratio of about ten to ten thousand by applying a pulse voltage to cause a current to flow.

Methods for operating ReRAM include the two types of a unipolar operation that changes the resistance by applying voltages of the same polarity and a bipolar operation that changes the resistance by applying voltages of different polarities. ReRAMs having bipolar operations include a metal filament-formed ReRAM that changes the resistance by applying a voltage to ionize the metal and cause metal ions to diffuse and precipitate inside the insulative variable resistance film to form filaments of the metal. A forming operation is unnecessary in the metal filament-formed ReRAM because filaments are formed by causing the metal ions to diffuse and precipitate inside the insulating film, and the resistance value of the insulating film itself is not changed as in an oxygen deficiency-formed ReRAM. Operations are possible at relatively low currents; and because the number of filaments decreases as the memory cell is downscaled, the amount of current flowing in the entire memory cell can be reduced while ensuring the amount of current flowing in one filament. Thereby, the amount of current can be scaled as the memory cell is downscaled.

However, the metal filament-formed ReRAM has low current operations (high resistance operations); and the filaments themselves are fine and easily decompose. Therefore, the fluctuation of the switching operation is large; and the state retention characteristics degrade. Compared to a ReRAM using a transition metal oxide, the operating current is small; but the current density undesirably increases and electromigration is undesirably promoted as the interconnects are made finer by downscaling. Electromigration is one type of diffusion phenomenon due to the interaction between the metal atoms inside the metal interconnect and the electrons flowing through the metal interconnect. When the current is caused to flow in the interconnect, the metal atoms included in the interconnect are bombarded by the electrons, receive momentum in the direction in which the electron current flows, and move via vacancies. New vacancies occur in the spaces from which the metal atoms move, the vacancies grow into voids as the number of vacancies increases, and the effective cross-sectional area of the metal interconnect decreases. As a result, the current density locally increases; the temperature increases due to Joule heat; the occurrence of the vacancies is accelerated; and eventually the contact is broken.

DETAILED DESCRIPTION

In general, according to one embodiment, a memory device includes a first electrode, a second electrode, and a variable resistance film. The variable resistance film is connected between the first electrode and the second electrode. The first electrode includes a metal contained in a matrix made of a conductive material. A cohesive energy of the metal is lower than a cohesive energy of the conductive material. A concentration of the metal at a central portion of the first electrode in a width-direction of the first electrode is higher than concentrations of the metal in two end portions of the first electrode in the width-direction.

In general, according to one embodiment, a memory device includes a first electrode, a second electrode, and a variable resistance film. The variable resistance film is connected between the first electrode and the second electrode. The first electrode includes a metal contained in a matrix made of a conductive material. A cohesive energy of the metal is lower than a cohesive energy of the conductive material. A concentration of the metal at an end portion of the first electrode in a width direction of the first electrode is higher than a concentration of the metal at a central portion of the first electrode in the width direction.

Embodiments of the invention will now be described with reference to the drawings.

A first embodiment will now be described.

Figure 1A:
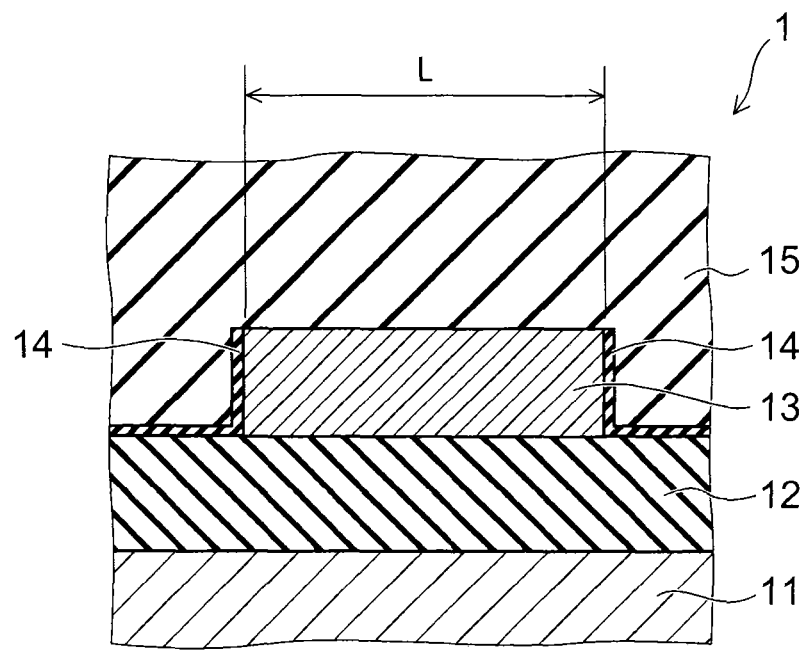
FIG. 1A is a cross-sectional view illustrating a memory device according to a first embodiment.
Figure 1B:
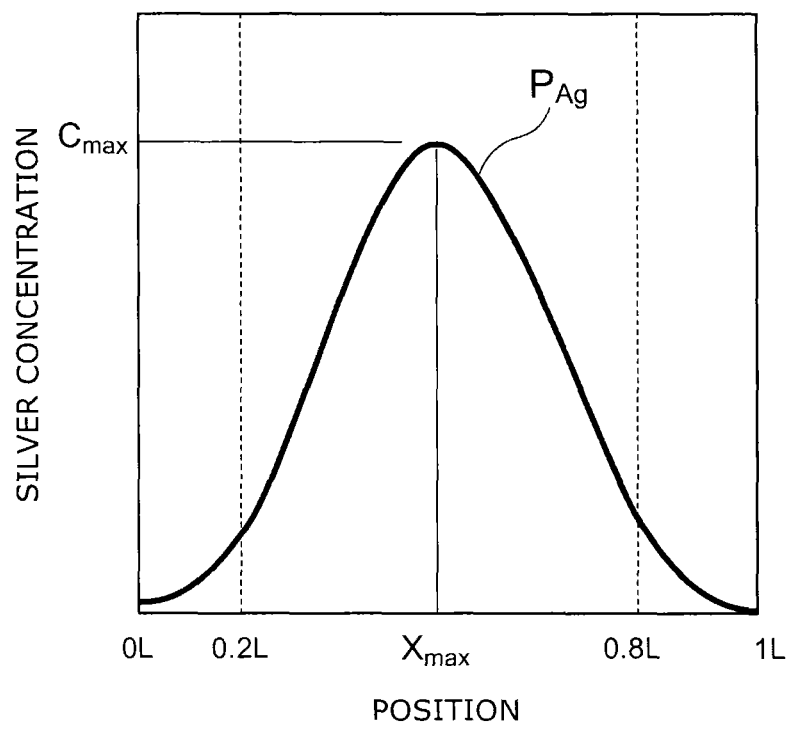
FIG. 1B is a graph illustrating a silver concentration profile inside the upper electrode.

FIG. 1A is a cross-sectional view illustrating a memory device according to the embodiment. FIG. 1B is a graph illustrating a silver concentration profile inside the upper electrode with the position in the width direction of the upper electrode illustrated on the horizontal axis and the silver concentration illustrated on the vertical axis.

The memory device according to the embodiment is a two-terminal nonvolatile memory, and in particular, a metal filament-formed ReRAM.

In the memory device 1 according to the embodiment as illustrated in FIGS. 1A and 1B, a lower electrode 11 extending in a first direction is provided; and a variable resistance film 12 is provided on the lower electrode 11. An upper electrode 13 extending in a second direction is provided on the variable resistance film 12. Thereby, the variable resistance film 12 is connected between the lower electrode 11 and the upper electrode 13. The second direction is orthogonal to the first direction; and the variable resistance film 12 spreads in a planar configuration along the first direction and the second direction. A liner film 14 is provided to cover the side surfaces of the upper electrode 13 and the region of the upper surface of the variable resistance film 12 not in contact with the upper electrode 13; and an inter-layer insulating film 15 is provided to cover the upper electrode 13 and the liner film 14.

The lower electrode 11 is formed of a conductive material such as a metal, etc. The lower electrode 11 includes, for example, at least one type of metal selected from the group consisting of tungsten, molybdenum, titanium, chrome, tantalum, and nickel, and is formed of, for example, tungsten. The conductive material included in the lower electrode 11 may be a semiconductor material into which an impurity is introduced, e.g., silicon doped with boron.

The variable resistance film 12 is formed of an insulating material. The variable resistance film 12 includes, for example, at least one type of material selected from the group consisting of amorphous silicon, polysilicon, silicon oxide, aluminum oxide, hafnium oxide, tantalum oxide, molybdenum oxide, nickel oxide, titanium oxide, niobium oxide, tungsten oxide, germanium sulfide, copper sulfide, chromium sulfide, silver sulfide, titanium sulfide, tungsten sulfide, nickel sulfide, tantalum sulfide, molybdenum sulfide, zinc sulfide, a germanium-selenium compound, a germanium-tellurium compound, a germanium-antimony-tellurium compound, and an arsenic-tellurium-germanium-silicon compound. The variable resistance film 12 is formed of, for example, non-doped amorphous silicon. The film thickness of the variable resistance film 12 is, for example, 10 nm. The variable resistance film 12 may be a stacked film. For example, a stacked film of an amorphous silicon layer and a silicon oxide layer may be used; and a stacked film of a silicon oxide layer and a high dielectric constant layer having a dielectric constant higher than that of silicon oxide may be used. In other words, the material configuration and the film thickness of the variable resistance film 12 may be set to obtain the desired resistance value.

The upper electrode 13 includes a metal used as an ion source contained inside a matrix made of a conductive material. The conductive material of the matrix (the matrix material) may be, for example, at least one type of metal material selected from the group consisting of tungsten, molybdenum, titanium, chrome, tantalum, and nickel and may be a semiconductor material into which an impurity is introduced. The matrix material is, for example, silicon doped with phosphorus. In such a case, it is favorable for the phosphorus concentration to be, for example, not less than $1\times10^{21}$ cm$^{-3}$.

The metal used as the ion source (the ion source metal) is a metal having a cohesive energy lower than the cohesive energy of the matrix material and is a metal that does not react with the material of the variable resistance film 12 and can diffuse through the variable resistance film 12. The cohesive energy is the attraction acting between atoms and is the energy necessary to pull away an atom or an ion of a liquid or a solid to infinity. Atoms having lower cohesive energies are easily ionized. The metal used as the ion source is, for example, at least one type of metal selected from the group consisting of lithium, chrome, iron, copper, indium, tellurium, calcium, sodium, silver, cobalt, and gold and is, for example, silver.

In other words, in an example of the materials of the memory device 1, the lower electrode 11 is made of tungsten; and the variable resistance film 12 is made of non-doped amorphous silicon. The upper electrode 13 includes silver introduced as the ion source metal into a matrix made of phosphorus-doped silicon. The liner film 14 is made of, for example, silicon nitride; and the inter-layer insulating film 15 is made of, for example, silicon oxide.

Then, as illustrated in FIG. 1B, a concentration profile $P_{Ag}$ of the silver inside the upper electrode 13 along the width direction (the first direction) of the upper electrode 13 has a maximum value $C_{max}$ at one location of the width direction central portion of the upper electrode 13. The distances from a position $X_{max}$ along the width direction of the upper electrode 13 where the profile $P_{Ag}$ has the maximum value $C_{max}$ to the two width direction ends of the upper electrode 13 are not less than 0.2 times a width L of the upper electrode 13. In other words, the coordinate of the position $X_{max}$ is within the range of not less than 0.2L and not more than 0.8L, where one width direction end portion of the upper electrode 13 is the origin. For example, the position $X_{max}$ is at the width direction center of the upper electrode 13; and the coordinate of the position $X_{max}$ is 0.5L. Therefore, the silver concentration in the width direction central portion of the upper electrode 13 is higher than the silver concentrations in the two width direction end portions of the upper electrode 13. The maximum value $C_{max}$ is not less than $1\times10^{22}$ cm$^{-3}$.

A method for manufacturing the memory device 1 according to the embodiment will now be described.

FIGS. 2A to 2D are cross-sectional views of processes, illustrating the method for manufacturing the memory device according to the embodiment.

Figure 2A:
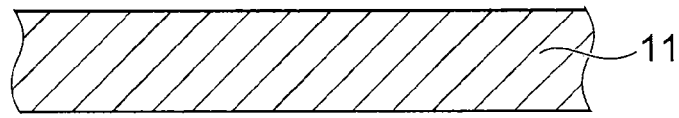
FIGS. 2A to 2D are cross-sectional views of processes, illustrating the method for manufacturing the memory device according to the first embodiment.

First, as illustrated in FIG. 2A, a tungsten film is formed by depositing tungsten on a semiconductor substrate (not illustrated). Although the method for forming the tungsten film is not particularly limited, for example, a deposition method using a gas source such as CVD (chemical vapor deposition), etc., may be used; and sputtering may be used. Then, for example, the multiple lower electrodes 11 extending in the first direction are formed by selectively removing the tungsten film by RIE (reactive ion etching). Then, an inter-electrode insulating film (not illustrated) is formed between the lower electrodes 11.

Figure 2B:
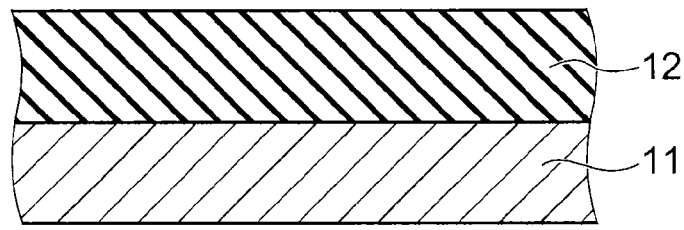

Then, as illustrated in FIG. 2B, the variable resistance film 12 is formed on the lower electrodes 11 and the inter-electrode insulating film. The thickness of the variable resistance film 12 is, for example, 10 nm. Although the method for forming the variable resistance film 12 is not particularly limited, for example, a deposition method using a gas source such as CVD, etc., may be used; and sputtering may be used.

Figure 2C:
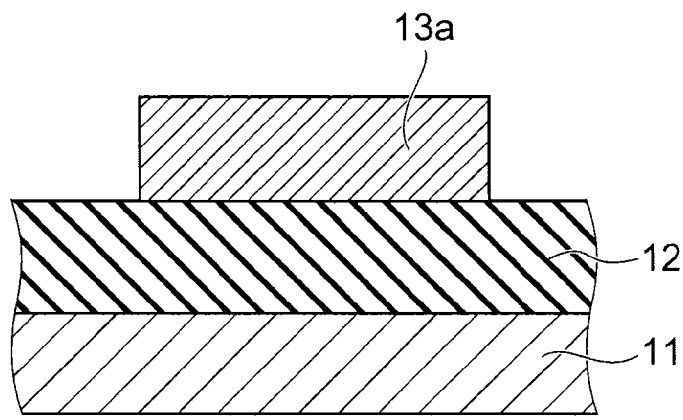

Continuing as illustrated in FIG. 2C, for example, a silicon film is formed on the variable resistance film 12 by depositing silicon by CVD. Although the method for forming the silicon film is not particularly limited, for example, a deposition method using a gas source such as CVD, etc., may be used; and sputtering may be used. Then, for example, the silicon film becomes a phosphorus-doped silicon film 13a by introducing phosphorus into the silicon film by ion implantation. The phosphorus concentration inside the phosphorus-doped silicon film 13a is, for example, not less than $1 \times 10^{21}$ cm$^{-3}$. Then, for example, the phosphorus-doped silicon film 13a is patterned into multiple interconnect configurations extending in the second direction by selectively removing the phosphorus-doped silicon film 13a by RIE.

Figure 2D:
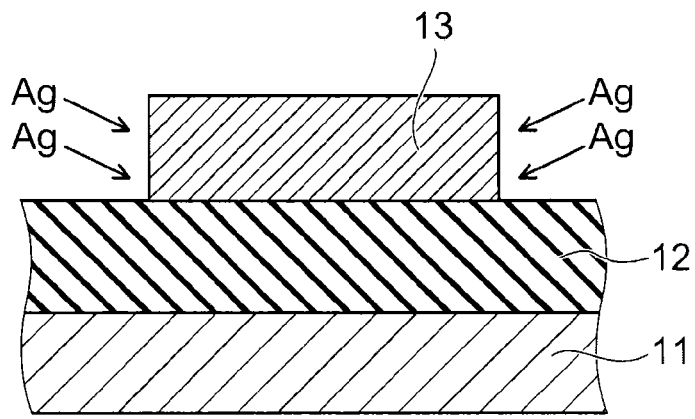

Then, as illustrated in FIG. 2D, silver ions are irradiated in a direction tilted toward the first-direction side with respect to the directly-downward direction. Thereby, ion implantation of the silver is performed into the phosphorus-doped silicon film 13a from both side surfaces of the phosphorus-doped silicon film 13a. At this time, much of the silver is implanted into the width direction central portion of the phosphorus-doped silicon film 13a by adjusting the acceleration voltage and/or the angle of the silver ions. The silver ions are not implanted into the variable resistance film 12 as much as possible. Thereby, the distribution of the silver inside the phosphorus-doped silicon film 13a is a distribution such as that illustrated by the silver concentration profile $P_{Ag}$ illustrated in FIG. 1B. At this time, the maximum value $C_{max}$ of the silver concentration is not less than $1 \times 10^{22}$ cm$^{-3}$; and the position $X_{max}$ along the width direction of the upper electrode 13 where the silver concentration has the maximum value $C_{max}$ is a position not less than 0.2L from the two width direction ends of the upper electrode 13. Thereby, the phosphorus-doped silicon film 13a becomes the upper electrode 13.

Continuing as illustrated in FIG. 1A, for example, the liner film 14 made of silicon nitride is formed to cover the upper electrodes 13. Then, the regions between the upper electrodes 13 are filled by depositing silicon oxide onto the entire surface. Continuing, the upper electrodes 13 are exposed by performing CMP (chemical mechanical polishing) to remove the silicon oxide and the liner film 14 that are on the upper surfaces of the upper electrodes 13. Then, the inter-layer insulating film 15 is formed by further depositing silicon oxide. Thus, the memory device 1 is manufactured. In the memory device 1, memory cells are formed at each of the most proximal points between the lower electrodes 11 and the upper electrodes 13. Thereby, in the memory device 1, many memory cells are formed and arranged in a two-dimensional matrix configuration along the first direction and the second direction.

Operations of the memory device according to the embodiment will now be described.

Figure 3:
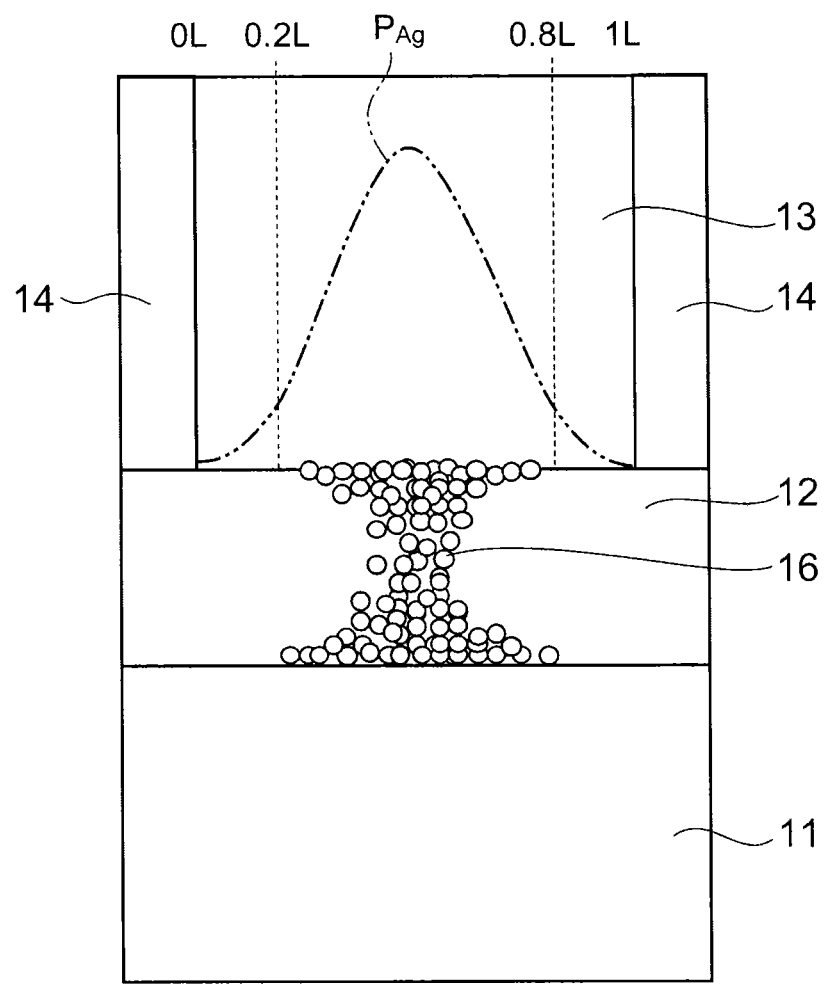
FIG. 3 is a schematic cross-sectional view illustrating operations of the memory device according to the first embodiment.

FIG. 3 is a schematic cross-sectional view illustrating operations of the memory device according to the embodiment.

The concentration profile $P_{Ag}$ of the silver and the width direction coordinates illustrated in FIG. 1B also are overlaid in FIG. 3.

The variable resistance film 12 which is made of an insulating material such as amorphous silicon, etc., has a high resistance value in the initial state in which the silver is not diffused into the variable resistance film 12.

From this state, as illustrated in FIG. 3, a forward voltage is applied between the lower electrode 11 and the upper electrode 13 such that the lower electrode 11 becomes a negative electrode and the upper electrode 13 becomes a positive electrode. Thereby, the silver atoms inside the upper electrode 13 are ionized to become positive silver ions. At this time, the silicon which is the matrix material of the upper electrode 13 is substantially not ionized because the cohesive energy of the silicon is higher than the cohesive energy of the silver. Then, due to the electric field formed between the lower electrode 11 and the upper electrode 13, the silver ions diffuse from the upper electrode 13 into the variable resistance film 12, bond to the electrons supplied by the lower electrode 11 to the variable resistance film 12, become silver atoms, and precipitate. Thereby, filaments 16 made of silver are formed to link the lower electrode 11 to the upper electrode 13 inside the variable resistance film 12. As a result, the resistance value of the variable resistance film 12 decreases.

On the other hand, when a reverse voltage is applied between the lower electrode 11 and the upper electrode 13 such that the lower electrode 11 becomes the positive electrode and the upper electrode 13 becomes the negative electrode, the silver atoms of the filaments 16 are ionized, become positive silver ions, and move toward the upper electrode 13. Thereby, the filaments 16 are divided; and the resistance value of the variable resistance film 12 increases. By the switching operation recited above, the resistance value of the variable resistance film 12 can be switched. Then, information corresponding to the resistance value of the variable resistance film 12 can be stored.

In the embodiment, the silver ions are supplied into the variable resistance film 12 mainly from the width direction central portion of the upper electrode 13 because the silver concentration of the width direction central portion is higher than the silver concentrations of the two width direction end portions inside the upper electrode 13. Accordingly, the filaments 16 are formed inside the variable resistance film 12 in the region directly under the width direction central portion of the upper electrode 13.

Effects of the embodiment will now be described.

Figure 4A:
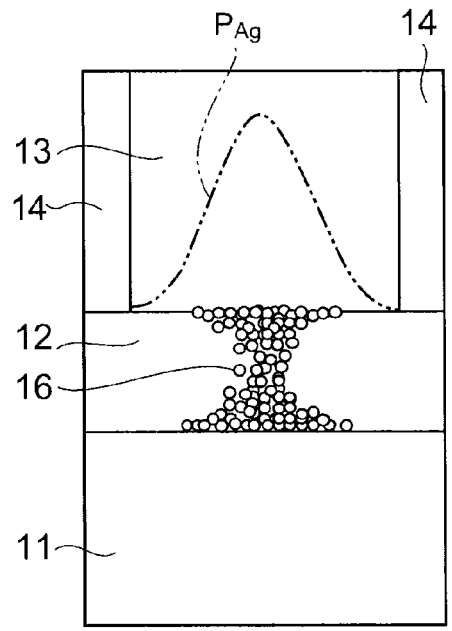
FIGS. 4A and 4B illustrate operations of the memory device according to the first embodiment.
Figure 4B:
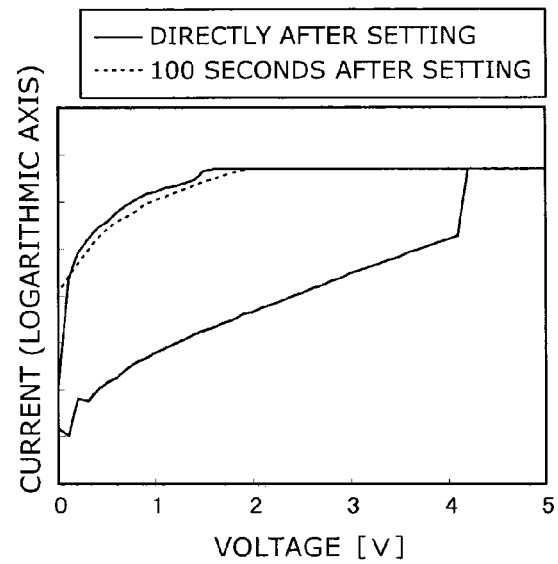
Figure 4C:
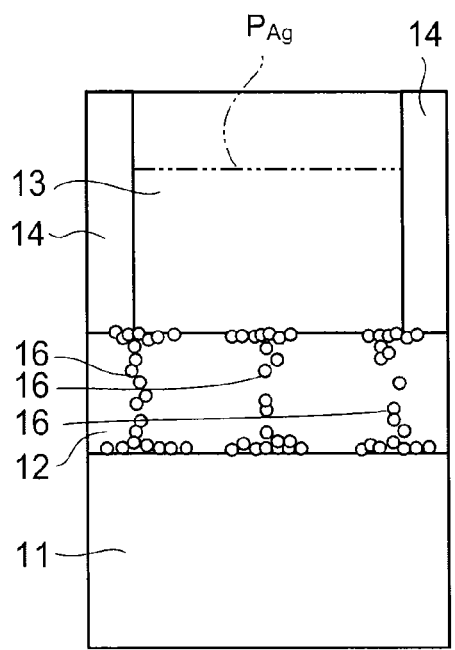
FIGS. 4C and 4D illustrate operations of a memory device according to a comparative example.
Figure 4D:
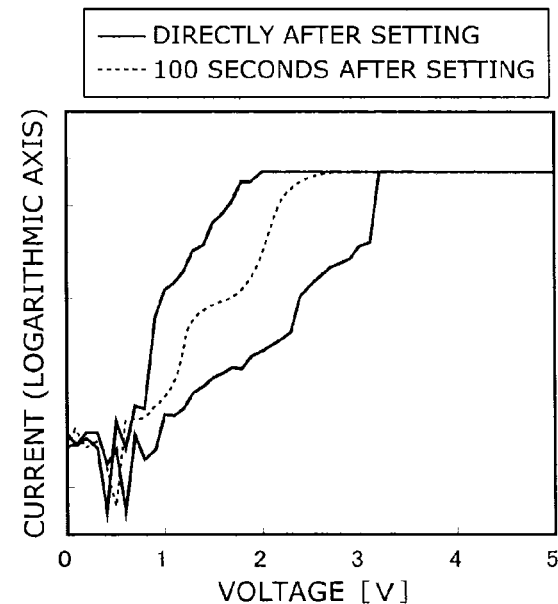

FIGS. 4A and 4B illustrate operations of the memory device according to the embodiment; FIGS. 4C and 4D illustrate operations of a memory device according to a comparative example. FIGS. 4A and 4C are schematic cross-sectional views; and FIGS. 4B and 4D are graphs illustrating current-voltage characteristics with the voltage illustrated on the horizontal axis and the current illustrated on the vertical axis. FIG. 4A is similar to FIG. 3.

Figure 5:
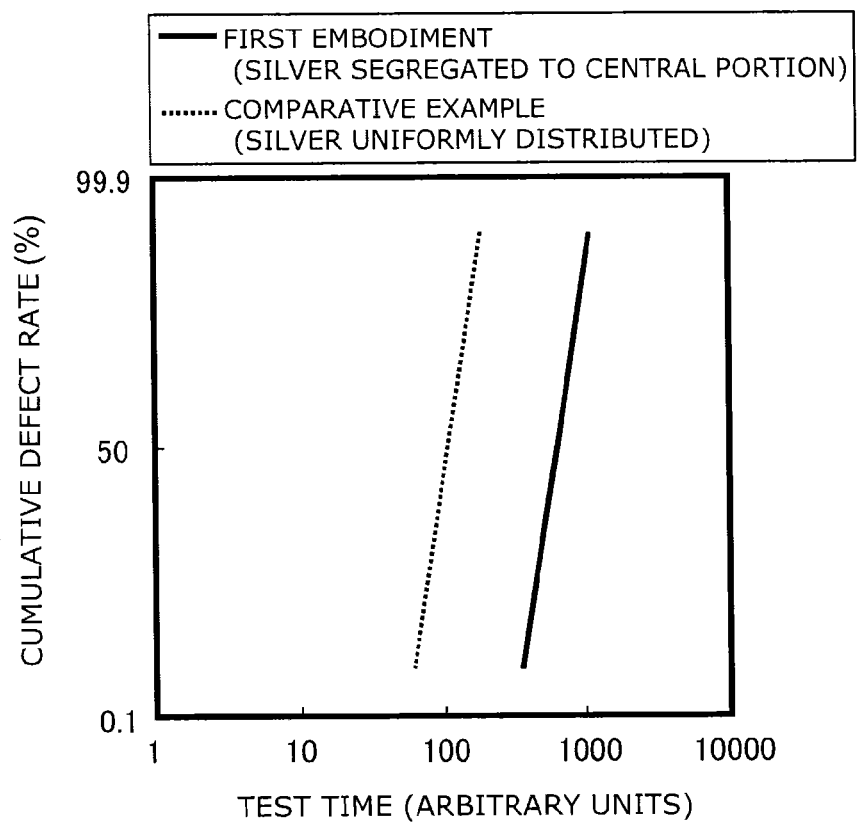
FIG. 5 is a graph illustrating results of a reliability test with the test time illustrated on the horizontal axis and the cumulative defect rate illustrated on the vertical axis.

FIG. 5 is a graph illustrating results of a reliability test with the test time illustrated on the horizontal axis and the cumulative defect rate illustrated on the vertical axis.

FIGS. 4B and 4D illustrate the current-voltage characteristics in the case where the voltage between the lower electrode 11 and the upper electrode 13 is increased from zero such that the upper electrode 13 becomes the positive electrode until the amount of current increases abruptly; and the voltage is subsequently reduced and returned to zero. As the voltage is gradually increased, the voltage at which the current abruptly increases is called the set voltage; and it is considered that the filaments 16 are formed inside the variable resistance film 12 at this time. After reaching the set voltage, a limit of the current value is provided such that an excessive current does not flow in the memory cell. Once the filaments are formed, the current that flows is larger than that of the voltage increase even as the voltage is subsequently reduced because the resistance value of the variable resistance film 12 is still low. Therefore, the current-voltage characteristic has a hysteresis curve.

In the memory device 1 according to the embodiment as illustrated in FIG. 4A, the filaments 16 are formed inside the variable resistance film 12 in only the region directly under the width direction central portion of the upper electrode 13 because the silver is segregated to the width direction central portion inside the upper electrode 13. Therefore, the number of filaments formed in one memory cell is low; and the individual filaments are commensurately thick and tough. Therefore, the resistance value is low in the case where the filaments communicate between the upper and lower electrodes.

As a result, as illustrated in FIG. 4B, the switching operation stabilizes because the on/off ratio of the resistance value can be increased and a large hysteresis can be obtained in the switching operation. By thick filaments being formed, the filaments once formed are not easily decomposed by thermal decomposition; and the retention characteristics of the states improve.

Conversely, in the case where the silver is uniformly included inside the upper electrode 13 as illustrated in FIG. 4C, the filaments are formed in the entire square region inside the variable resistance film 12 where the lower electrode 11 overlays the upper electrode 13. Therefore, the number of filaments formed in one memory cell is high; and each of the filaments is commensurately fine and fragile. Therefore, the resistance value is relatively high even in the case where the filaments communicate between the upper and lower electrodes.

As a result, as illustrated in FIG. 4D, the switching operation is unstable because the on/off ratio of the resistance value decreases and the hysteresis of the switching operation decreases. Because the individual filaments are fine, thermal decomposition of the filaments undesirably occurs in a relatively short period of time; and the retention characteristics of the states are poor.

This point will now be examined quantitatively using a simple model. The number of filaments formed in a memory cell is proportional to the surface area of the region where the filaments can be formed. The cross-sectional area of one filament is inversely proportional to the number of filaments formed in each of the memory cells. Then, the radius of each of the filaments is proportional to the square root of the cross-sectional area. On the other hand, if the filament divides when the silicon around the filament reaches the center of the filament due to diffusion, the life of the filament is proportional to the time for the diffusion distance of the silicon to become equal to the radius of the filament. The diffusion distance is proportional to $\sqrt{(Dt)}$, where the diffusion coefficient is D and the time is t. The relationships described above can be summarized as $\{1/\sqrt{(\text{surface area of region where filaments can be formed})}\} \propto \{1/\sqrt{(\text{number of filaments})}\} \propto \{\sqrt{(\text{cross-sectional area of filaments})}\} \propto (\text{radius of filaments}) = (\text{diffusion distance}) \propto \{\sqrt{(\text{life of filaments})}\}$; and the life of the filaments is inversely proportional to the surface area of the region where the filaments can be formed.

In the comparative example illustrated in FIGS. 4C and 4D, the region where the filaments are formed is the square region where the upper electrode 13 overlays the lower electrode 11 as viewed from above and has a surface area of (L×L). Conversely, in the embodiment illustrated in FIGS. 4A and 4B, the region where the filaments are formed is the rectangular region where the central portion of the upper electrode 13 overlays the lower electrode 11 and has a surface area of (0.6L×L) if the silver is uniformly distributed in the rectangular region. Therefore, the embodiment has a surface area of the region where the filaments are formed that is 0.6 times that of the comparative example, and accordingly, has a life of the filaments that is 1/0.6=1.7 times that of the comparative example. In the embodiment, if the silver inside the upper electrode 13 is segregated particularly to the central portion of the rectangular region described above, the number of filaments decreases further; and the life is longer than 1.7 times that of the comparative example.

As illustrated in FIG. 5, results of a simulation of the change over time of the defect rate when an operating current flows in the memory cells of the memory device shows that the memory device according to the embodiment reached a constant cumulative defect rate after a long period of time that was about 10 times that of the memory device according to the comparative example.

Thus, compared to the comparative example illustrated in FIGS. 4C and 4D, the switching operation is stable and the retention characteristics of the states improve for the embodiment illustrated in FIGS. 4A and 4B.

Generally, in a ReRAM, the region where the upper and lower interconnects overlay, i.e., the surface area of the region where the filaments are formed, decreases as the interconnects become finer. Thereby, the number of filaments formed in each of the memory cells decreases. As a result, the individual filaments become thick and tough; and the state retention characteristics improve. However, the downscaling of the interconnects is constrained by the lithography technology and the like; and unless epoch-making progress of the lithography technology is made, it is difficult to realize drastic downscaling in a short period of time. However, according to the embodiment as described above, effects similar to those of the case where the interconnects, i.e., the lower electrode 11 and the upper electrode 13, are downscaled can be obtained because the region where the filaments 16 are formed is limited by the ion source metal being segregated to the width direction central portion of the upper electrode 13. In other words, the advantages to be obtained in the future when the interconnects are downscaled can be obtained ahead of time.

The effects of the position $X_{max}$ where the silver concentration has the maximum value $C_{max}$ being not less than 0.2L from the two width direction ends of the upper electrode 13 will now be described.

As described above, the upper electrode 13 is patterned into an interconnect configuration extending in the second direction. Generally, current substantially does not flow at the side portion of the interconnect because a roughness is unavoidably formed in the side surfaces of the interconnect and the electrons have inelastic scattering at the interconnect surfaces. Therefore, the portion of the interconnect excluding the two width direction end portions is the substantial current path. Then, by the position $X_{max}$ being disposed inside the substantial current path of the upper electrode 13, the filaments 16 can be directly linked in this current path. As a result, the resistance when the current is caused to flow between the upper electrode 13 and the lower electrode 11 via the filaments 16 decreases; and electromigration can be more effectively suppressed.

The size of the roughness of the side surfaces of the upper electrode 13 is, for example, about 2 to 3 nm for the total of both side surfaces. On the other hand, it is desirable for the interconnect width L of the upper electrode 13 to be downscaled to not more than 20 nm. In such a case, because L=20 nm and 0.2L=4 nm, the filaments can be formed at a position where the effects of the roughness are reliably eliminated by the position $X_{max}$ being not less than 0.2L from the two width direction ends of the upper electrode 13. This effect is particularly large in the case where the width of the upper electrode 13 is not more than 20 nm.

The interconnect resistance of the upper electrode 13 can be reduced by the silver used as the ion source being segregated inside the substantial current path of the upper electrode 13. Thereby, the occurrence of the electromigration in the upper electrode 13 can be suppressed. By increasing the electromigration resistance of the memory device 1, high suitability for mass production can be realized even when downscaling.

By the filaments 16 being formed inside the variable resistance film 12 in the region directly under the width direction central portion of the upper electrode 13, the formation of the filaments inside the variable resistance film 12 between mutually-adjacent upper electrodes 13 can be suppressed. Thereby, shorts between the upper electrodes 13 can be suppressed. As a result, the degrees of freedom of the driving increase because a high voltage can be applied between the mutually-adjacent upper electrodes 13. Because the distance between the upper electrodes 13 can be shortened, downscaling of the memory device 1 can be realized. Although it is considered that the matrix material (the silicon) of the upper electrode 13 may be ionized and filaments of the matrix material may be formed between the upper electrodes 13 even in the case where the ion source metal (the silver) is segregated to the width direction central portion of the upper electrode 13, such filaments do not easily form because the cohesive energy of the silicon is high and the silicon does not easily ionize.

The effects of the maximum value $C_{max}$ of the concentration of the ion source metal of the upper electrode 13 being not less than $1 \times 10^{22}$ atoms/cm$^3$ will now be described.

Figure 6:
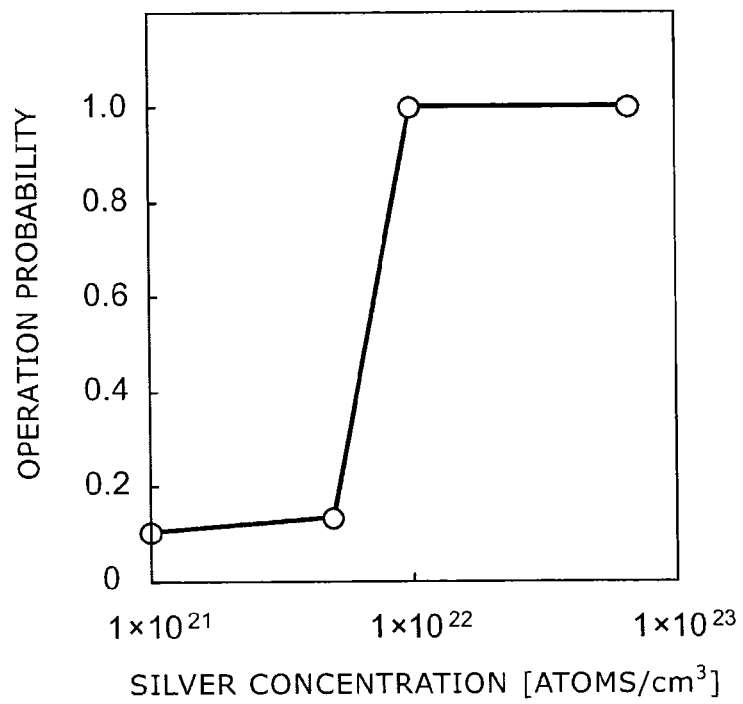
FIG. 6 is a graph illustrating effects of the silver concentration inside the upper electrode on the stability of the switching operation.

FIG. 6 is a graph illustrating effects of the silver concentration inside the upper electrode on the stability of the switching operation, with the silver concentration inside the upper electrode illustrated on the horizontal axis and the operation probability of the memory cell illustrated on the vertical axis.

Figure 7:
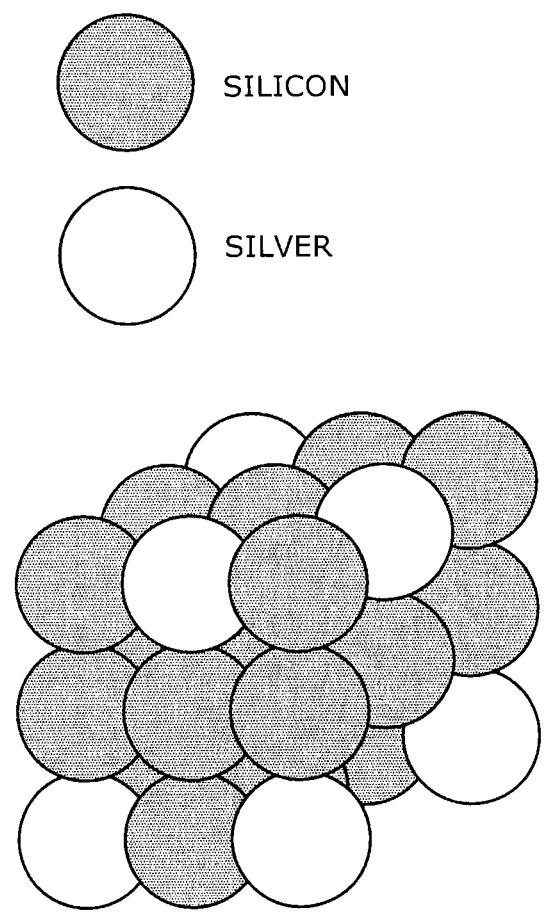
FIG. 7 illustrates the crystal structure of the silicon-silver mixture.

FIG. 7 illustrates the crystal structure of the silicon-silver mixture.

Figure 8:
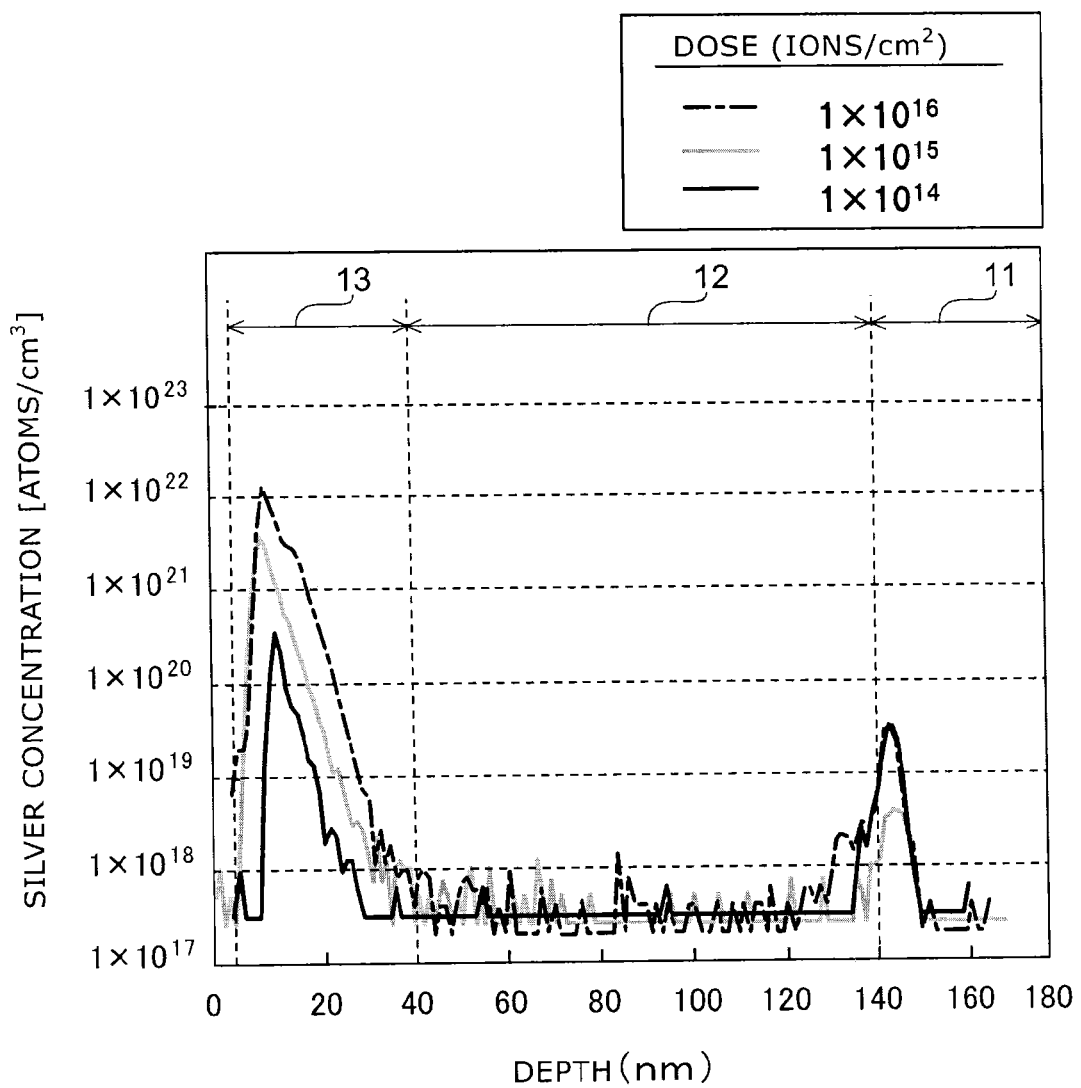
FIG. 8 is a graph illustrating the silver concentration profile along the vertical direction.

FIG. 8 is a graph illustrating the silver concentration profile along the vertical direction, with the vertical-direction position (the depth) using the upper surface of the upper electrode as a reference illustrated on the horizontal axis and the silver concentration illustrated on the vertical axis.

Figure 9:
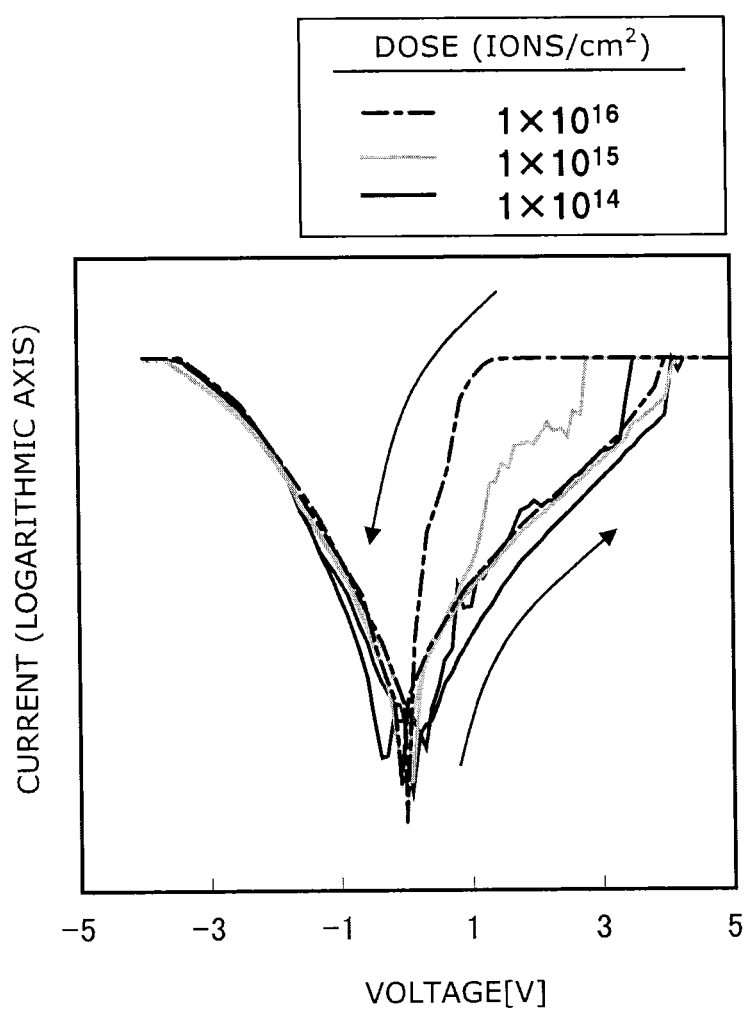
FIG. 9 is a graph illustrating the effects of the dose on the current-voltage characteristics.

FIG. 9 is a graph illustrating the effects of the dose on the current-voltage characteristics, with the voltage illustrated on the horizontal axis and the current illustrated on the vertical axis.

Figures 10A, 10B:
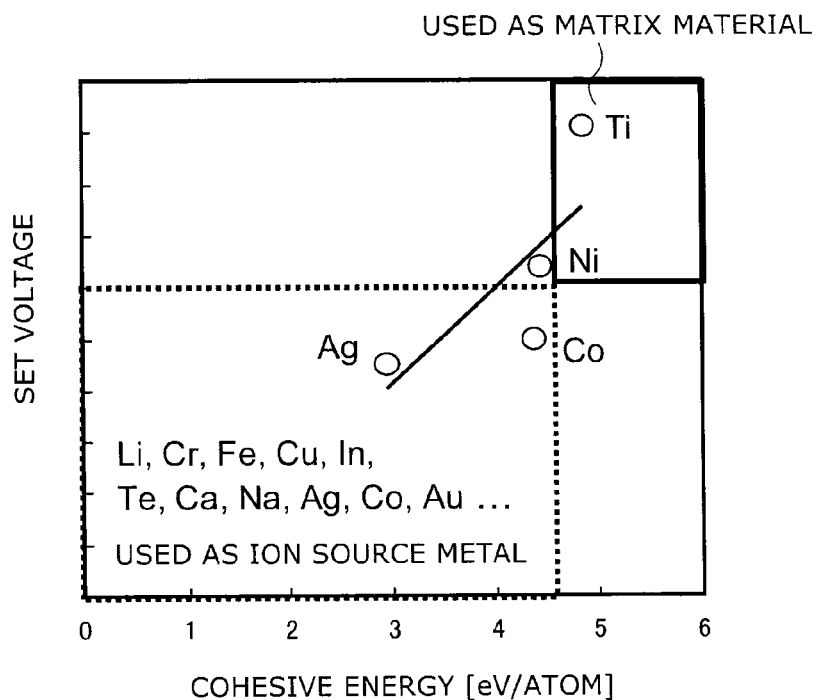
FIG. 10A is a graph illustrating the relationship between the cohesive energy of the ion source metal and the set voltage of the memory cell.
FIG. 10B illustrates an example of combinations of the matrix materials and the ion source metals.

FIG. 10A is a graph illustrating the relationship between the cohesive energy of the ion source metal and the set voltage of the memory cell, with the cohesive energy of the ion source metal illustrated on the horizontal axis and the set voltage of the memory cell illustrated on the vertical axis; and FIG. 10B illustrates an example of combinations of the matrix materials and the ion source metals.

The effects of the silver concentration inside the upper electrode 13 on the stability of the operation of the memory cell will now be described.

The amount of current of a memory cell in the high resistance state was measured by applying a voltage of 2 V. Then, the voltage was increased to the set voltage to perform the setting; subsequently, the voltage was returned to 2 V; and the amount of current was measured again. Then, the memory cell was determined to be switched if the current value after the setting was not less than 10 times the amount of current before the setting; the memory cell was determined to be not-switched if the current value after the setting was less than 10 times the amount of current before the setting; and the operation probability was taken as the proportion of the switched memory cells to all of the memory cells.

As illustrated in FIG. 6, although the operation probability of the memory cells is about 0.1 when the silver concentration inside the upper electrode is $1 \times 10^{21}$ atoms/cm$^3$, the operation probability increases to slightly more than 0.1 when the silver concentration becomes $6 \times 10^{21}$ atoms/cm$^3$. Then, the operation probability abruptly increases and becomes substantially 1 when the silver concentration becomes $1 \times 10^{22}$ atoms/cm$^3$. Generally, the atomic density of metal is about $7 \times 10^{22}$ atoms/cm$^3$. The plot of the silver concentration at $7 \times 10^{22}$ atoms/cm$^3$ illustrated in FIG. 6 corresponds to the case where the upper electrode is pure silver.

The reason that the operation probability abruptly increases when the silver concentration increases from $6 \times 10^{21}$ atoms/cm$^3$ to $1 \times 10^{22}$ atoms/cm$^3$ is estimated to be as follows.

As illustrated in FIG. 7, the upper electrode 13 includes silver used as the ion source contained inside a matrix made of phosphorus-doped silicon. Therefore, the crystal structure of the upper electrode 13 is a structure in which the silicon atoms and the silver atoms coexist. In such a structure, if one silver atom contacts another silver atom, the silver atoms can exist as solid silver. Thereby, it is considered that if an energy higher than the cohesive energy of the silver is applied, the silver atoms can be ionized to contribute to the operation of the memory cell. Conversely, if the one silver atom is not in contact with another silver atom, only silicon atoms are around the one silver atom; and the one silver atom exists as an independent atom. Thereby, it is considered that the one silver atom does not easily contribute to the operation of the memory cell because the one silver atom does not exist as solid silver and is difficult to ionize.

When the silver concentration inside the upper electrode 13 is $1 \times 10^{22}$ atoms/cm$^3$ or more, it is estimated that the silver atoms stochastically contact each other. This reason is considered to be as follows. When viewed from the one silver atom, it is necessary for the probability of an atom being a silver atom to be not less than ½ in order for at least one of the two atoms disposed adjacently to the one silver atom in any one direction to be a silver atom. Then, it is sufficient for the probability of an atom being a silver atom to be not less than $(½)^3 = ⅛$ in order for at least one of the atoms adjacent in the X direction, the Y direction, and the Z direction of orthogonal coordinates to be a silver atom. In the case where the silver concentration inside the upper electrode 13 is not less than $1 \times 10^{22}$ atoms/cm$^3$, it is considered that the silver atoms stochastically contact each other because the silver concentration is not less than ⅛ of $7 \times 10^{22}$ atoms/cm$^3$ which is the silver concentration of pure silver. This is similar not only in the case where the matrix is silicon but also in the case where the matrix is a metal. Also, this is similar not only in the case where the ion source metal is silver but also in the case where the ion source metal is another metal.

As illustrated in FIG. 8, the maximum value $C_{max}$ of the silver concentration of the upper electrode 13 increases as the dose of the silver ions that are ion-implanted in the process illustrated in FIG. 2D increases. Then, the maximum value $C_{max}$ of the silver concentration becomes $1 \times 10^{22}$ atoms/cm$^3$ or more when the dose of the silver ions is $1 \times 10^{16}$ ions/cm$^2$. A portion of the silver ions implanted into the upper electrode 13 diffuses through the variable resistance film 12 and precipitates at the interface between the variable resistance film 12 and the lower electrode 11.

As illustrated in FIG. 9, the hysteresis amount during the switching operation increases and the switching operation stabilizes as the dose of the silver increases, that is, as the silver concentration of the upper electrode 13 increases. In the case where the dose of the silver ions is $1 \times 10^{16}$ ions/cm$^2$, the hysteresis amount is exceedingly large; and the switching operation is more stable. From FIG. 8, the maximum value $C_{max}$ of the silver concentration at this time is not less than $1 \times 10^{22}$ atoms/cm$^3$.

As illustrated in FIG. 10A, the set voltage of the memory cell can be reduced by using silver as the ion source metal. Thereby, in the memory device 1, the degrees of freedom of the driving can be increased; and the memory cell can be downscaled. As illustrated in FIG. 10A, the set voltage decreases as the cohesive energy of the ion source metal decreases. This is considered to be because the ion source metal does not easily ionize and the filaments are not easily formed as the cohesive energy of the ion source metal decreases.

The combination of the matrix material and the ion source metal of the upper electrode 13 is not limited to silicon and silver; and it is sufficient for the cohesive energy of the ion source metal to be lower than the cohesive energy of the matrix material in the combination. Thereby, only the ion source metal can be ionized without ionizing the matrix material when the appropriate voltage is applied. As a result, only the ion source metal contributes to the formation of the filaments; and the matrix material functions as a stable interconnect material.

FIG. 10B illustrates examples of possible combinations of the matrix materials and the ion source metals. In FIG. 10B, a white circle in the field positioned at the intersection between a row of the matrix material and a column of the ion source metal indicates that this combination of the matrix material and the ion source metal is possible; and an x indicates that this combination is impossible.

A second embodiment will now be described.

Figure 11:
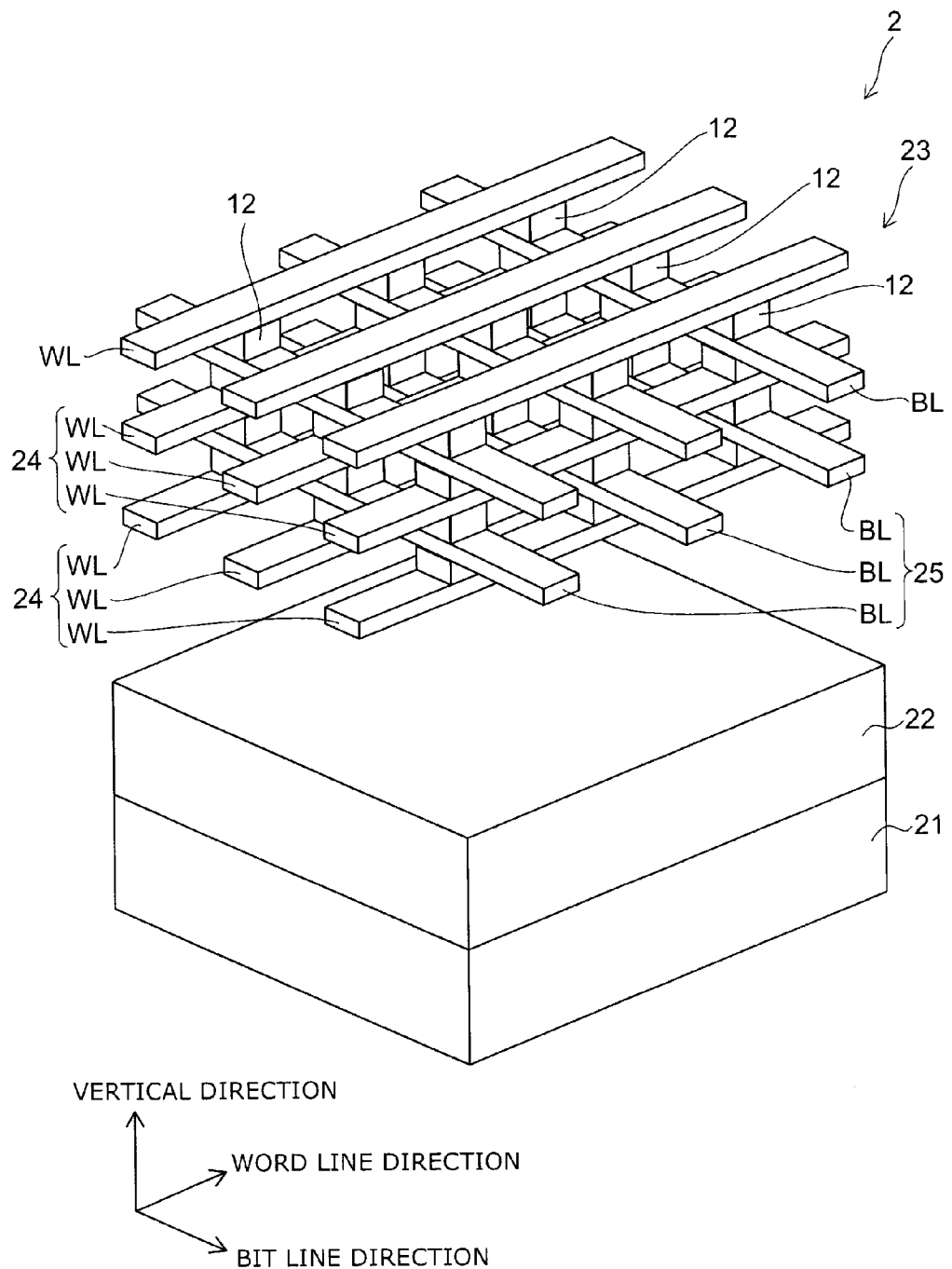
FIG. 11 is a perspective view illustrating a memory device according to a second embodiment.

FIG. 11 is a perspective view illustrating a memory device according to the embodiment.

The embodiment is an example in which the memory device according to the first embodiment described above is integrated in a cross-point structure.

In the memory device 2 according to the embodiment as illustrated in FIG. 11, a silicon substrate 21 is provided; and a drive circuit (not illustrated) of the memory device 2 is formed in the upper layer portion and on the upper surface of the silicon substrate 21. For example, an inter-layer insulating film 22 made of silicon oxide is provided on the silicon substrate 21 to bury the drive circuit; and a memory cell unit 23 is provided on the inter-layer insulating film 22.

In the memory cell unit 23, a word line interconnect layer 24 including multiple word lines WL extending in one direction (hereinbelow, called the word line direction) parallel to the upper surface of the silicon substrate 21 is alternately stacked with a bit line interconnect layer 25 including multiple bit lines BL extending in a direction (hereinbelow, called the bit line direction) that is parallel to the upper surface of the silicon substrate 21 to cross, e.g., to be orthogonal to, the word line direction with the inter-layer insulating film 15 (referring to FIG. 1A) interposed. The word lines WL do not contact each other; the bit lines BL do not contact each other; and the word lines WL do not contact the bit lines BL.

The variable resistance film 12 is provided between the word line interconnect layer 24 and the bit line interconnect layer 25. Although an example is illustrated in FIG. 11 in which the variable resistance film 12 is divided into each of the most proximal points between the word lines WL and the bit lines BL, the variable resistance film 12 may be one continuous film as in the first embodiment described above. The variable resistance film 12 is connected between each of the word lines WL and each of the bit lines BL. In the memory device 2, a memory cell is formed at each of the most proximal points between the word lines WL and the bit lines BL.

The configuration of each of the memory cells in the memory device 2 is similar to that of the memory device 1 according to the first embodiment described above. In other words, in the embodiment, the word line WL corresponds to the lower electrode 11 of the first embodiment; and the bit line BL corresponds to the upper electrode 13. Accordingly, the bit line BL includes, for example, silver as the ion source metal contained inside a matrix made of, for example, phosphorus-doped silicon. The silver is segregated to the width direction central portion of the bit line BL. In other words, the concentration of the silver in the width direction central portion of the bit line BL is higher than the concentrations of the silver in the two width direction end portions. Thereby, many memory cells are arranged in a three-dimensional matrix configuration along the word line direction, the bit line direction, and the vertical direction.

According to the embodiment, the memory cells can be three-dimensionally integrated by using a cross-point structure. Thereby, the integration of the memory cells can be increased. Otherwise, the configuration, the operations, and the effects of the embodiment are similar to those of the first embodiment described above.

Although an example is illustrated in the embodiment in which the word line WL corresponds to the lower electrode 11 of the first embodiment and the bit line BL corresponds to the upper electrode 13, the word line WL and the lower electrode 11 may be separate members. In such a case, the lower electrode 11 is formed at the positions corresponding to each of the memory cells on the word line WL. Similarly, the bit line BL and the upper electrode 13 may be separate members. Further, one set selected from the set including the word line WL and the lower electrode 11 and the set including the bit line BL and the upper electrode 13 may be formed of a common member; and the other set may be formed of separate members.

According to the first and second embodiments described above, a memory device having low fluctuation of the switching operation can be realized.

A third embodiment will now be described.

Figure 12A:
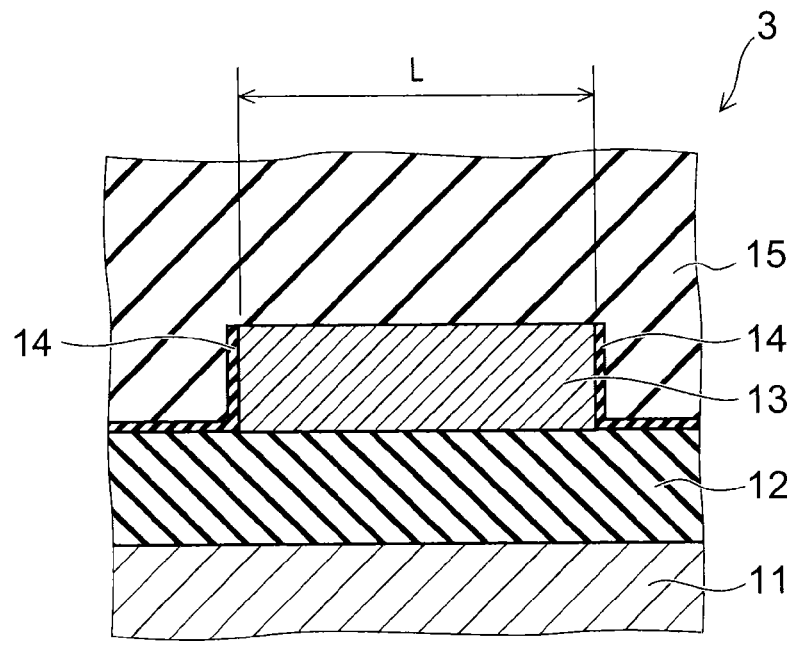
FIG. 12A is a cross-sectional view illustrating a memory device according to a third embodiment.
Figure 12B:
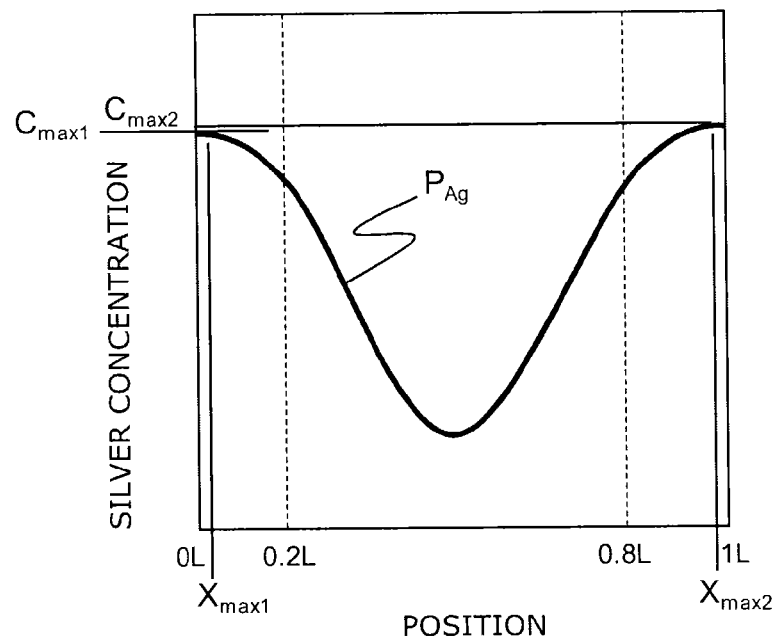
FIG. 12B is a graph illustrating the silver concentration profile inside the upper electrode, with the position of the upper electrode in the width direction illustrated on the horizontal axis and the silver concentration illustrated on the vertical axis.

FIG. 12A is a cross-sectional view illustrating a memory device according to the embodiment; and FIG. 12B is a graph illustrating the silver concentration profile inside the upper electrode, with the position of the upper electrode in the width direction illustrated on the horizontal axis and the silver concentration illustrated on the vertical axis.

The memory device according to the embodiment is also a two-terminal nonvolatile memory, and in particular, a metal filament-formed ReRAM.

As illustrated in FIG. 12A, the layer structure and the materials of the portions of the memory device 3 according to the embodiment are similar to the layer structure of the memory device 1 (referring to FIG. 1A) according to the first embodiment described above. However, the concentration profile of the silver inside the upper electrode 13 of the memory device 3 is different from that of the memory device 1.

Namely, as illustrated in FIG. 12B, the concentration profile $P_{Ag}$ of the silver inside the upper electrode 13 along the width direction (the first direction) of the upper electrode 13 has a maximum value $C_{max1}$ and a maximum value $C_{max2}$ at the two width direction end portions of the upper electrode 13, respectively. Although the maximum value $C_{max1}$ and the maximum value $C_{max2}$ may be mutually different values, it is favorable for the values to be as similar as possible. The distance from a position $X_{max1}$ along the width direction of the upper electrode 13 where the profile $P_{Ag}$ has the maximum value $C_{max1}$ to the width direction end of the upper electrode 13 and the distance from a position $X_{max2}$ along the width direction of the upper electrode 13 where the profile $P_{Ag}$ has the maximum value $C_{max2}$ are less than 0.2 times the width L of the upper electrode 13. In other words, when one end portion of the upper electrode 13 in the width direction is used as an origin, the coordinate of the position $X_{max1}$ is within a range that is not less than 0 and less than 0.2L; and the coordinate of the position $X_{max2}$ is within a range that is greater than 0.8L and not more than L. The profile $P_{Ag}$ at the width direction central portion of the upper electrode 13, i.e., where the coordinate is within a range that is not less than 0.2L and not more than 0.8L, is smaller than the values of both the maximum value $C_{max1}$ and the maximum value $C_{max2}$ of the two width direction end portions of the upper electrode 13. Accordingly, the silver concentrations at the two width direction end portions of the upper electrode 13 are higher than the silver concentration at the width direction central portion of the upper electrode 13. The maximum value $C_{max1}$ and $C_{max2}$ are not less than $1 \times 10^{22}$ cm$^{-3}$.

A method for manufacturing the memory device 3 according to the embodiment will now be described.

In the method for manufacturing the memory device 3 according to the embodiment, the acceleration voltage and the implantation angle of the silver ions of the implantation process of the silver ions illustrated in FIG. 2D are different from those of the method for manufacturing the memory device 1 (referring to FIGS. 2A to 2D) according to the first embodiment described above.

Namely, in the process illustrated in FIG. 2D, the silver ions are irradiated in directions that are tilted toward the first-direction side with respect to the directly downward direction. Thereby, ion implantation of the silver into the phosphorus-doped silicon film 13a is performed from both side surfaces of the phosphorus-doped silicon film 13a. In such a case, much of the silver is implanted into the two width direction end portions of the phosphorus-doped silicon film 13a by adjusting the acceleration voltage and/or the angle of the silver ions. The silver ions are not implanted into the variable resistance film 12 as much as possible. Thereby, the distribution of the silver in the phosphorus-doped silicon film 13a is a distribution such as that of the silver concentration profile $P_{Ag}$ illustrated in FIG. 12B. In such a case, the maximum values $C_{max1}$ and $C_{max2}$ of the silver concentration are not less than $1 \times 10^{22}$ cm$^{-3}$; and the positions $X_{max1}$ and $X_{max2}$ along the width direction of the upper electrode 13 where the silver concentration is the maximum values $C_{max1}$ and $C_{max2}$ are less than 0.2L from the two width direction ends of the upper electrode 13, respectively. Thereby, the phosphorus-doped silicon film 13a becomes the upper electrode 13.

Operations of the memory device according to the embodiment will now be described.

Figure 13A:
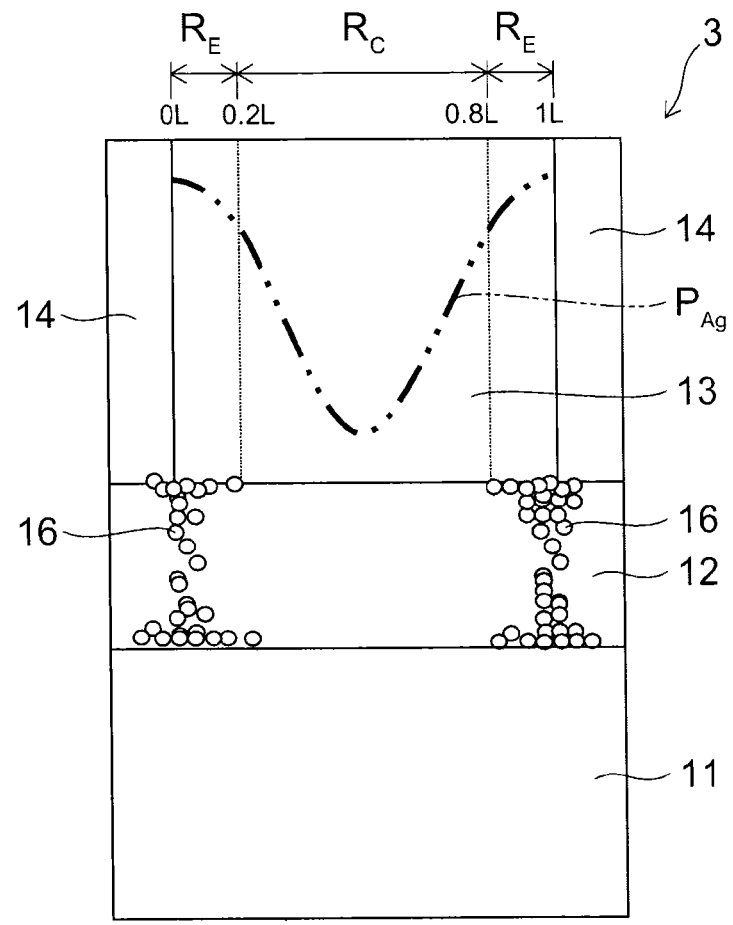
FIG. 13A is a schematic cross-sectional view illustrating operations of the memory device according to the third embodiment.
Figure 13B:
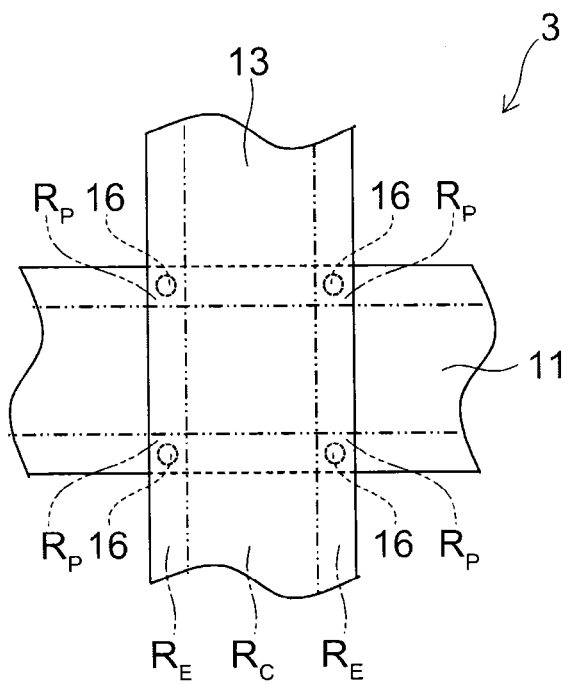
FIG. 13B is a schematic plan view illustrating operations of the memory device according to the third embodiment.

FIG. 13A is a schematic cross-sectional view illustrating operations of the memory device according to the embodiment; and FIG. 13B is a schematic plan view illustrating operations of the memory device according to the embodiment.

The concentration profile $P_{Ag}$ of the silver and the width direction coordinates illustrated in FIG. 12B also are overlaid in FIG. 13A.

In the embodiment as illustrated in FIGS. 13A and 13B, the silver ions are supplied into the variable resistance film 12 mainly from two width direction end portions $R_E$ of the upper electrode 13 because the silver concentrations at the two width direction end portions $R_E$ are higher than the silver concentration at a width direction central portion $R_C$ inside the upper electrode 13. Accordingly, the filaments 16 are formed inside the variable resistance film 12 in the regions directly under the two width direction end portions $R_E$ of the upper electrode 13. As illustrated in FIG. 13B, the electric field of both the lower electrode 11 and the upper electrode 13 concentrates at the edge portions, i.e., the two width direction end portions. Therefore, the filaments 16 are formed particularly easily at corner regions $R_P$ of the four locations where the two end portions of the lower electrode 11 overlay the two end portions of the upper electrode 13 as viewed from above.

Effects of the embodiment will now be described.

Figure 14A:
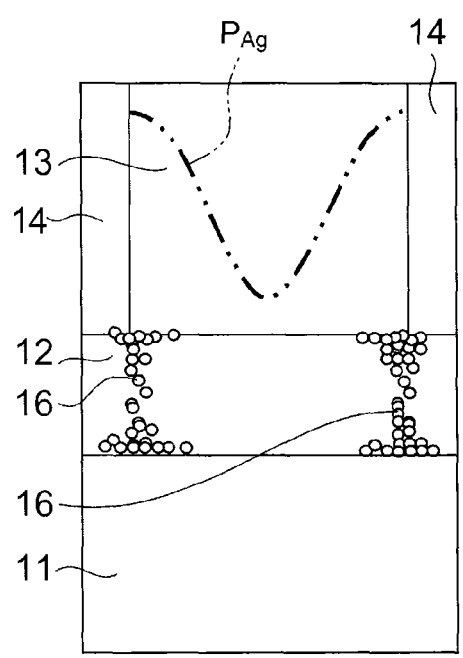
FIGS. 14A and 14B illustrate operations of the memory device according to the third embodiment.
Figure 14B:
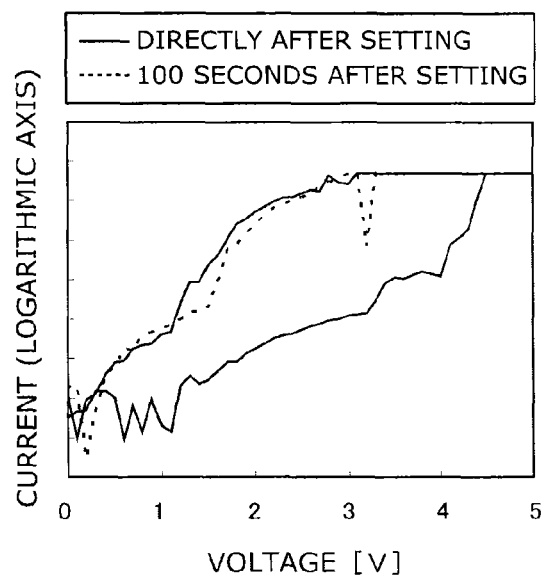

FIGS. 14A and 14B illustrate operations of the memory device according to the embodiment.

FIG. 14A is a schematic cross-sectional view; and FIG. 14B is a graph illustrating current-voltage characteristics, with the voltage illustrated on the horizontal axis and the current illustrated on the vertical axis. FIG. 14A is similar to FIG. 13A.

Figure 15:
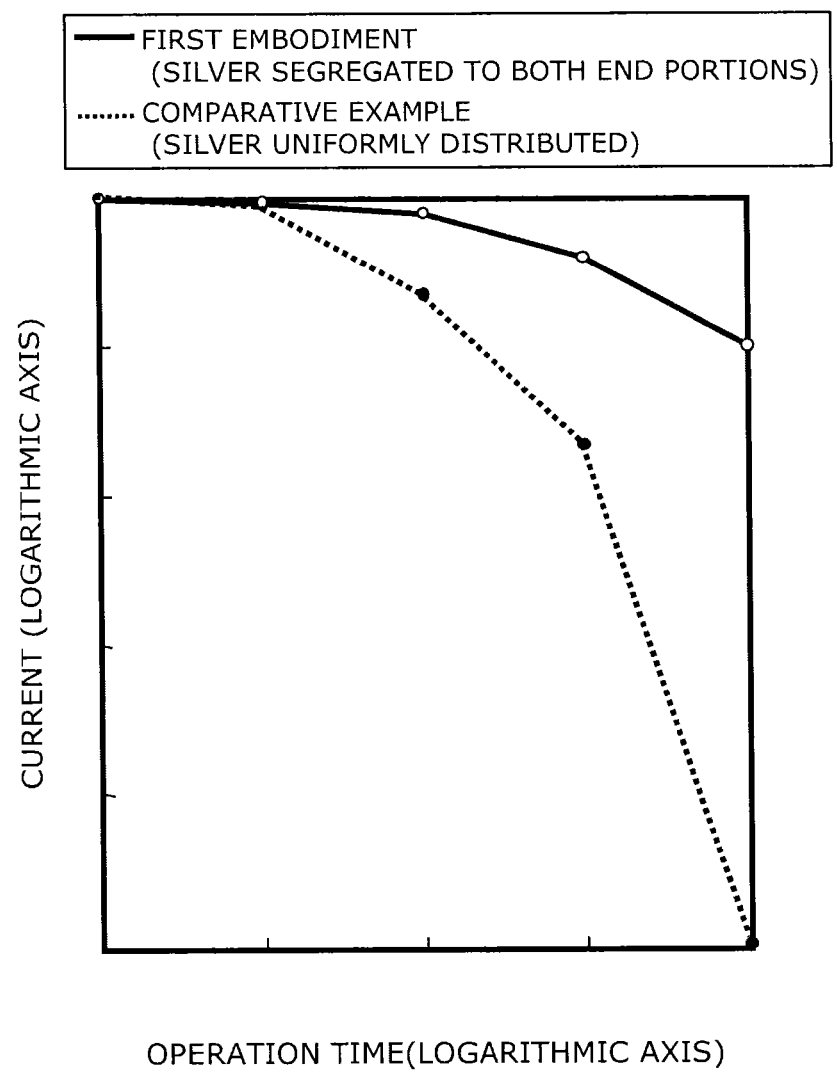
FIG. 15 is a graph illustrating the change over time of the electrical resistance value of the variable resistance film, with the operation time illustrated on the horizontal axis and the current illustrated on the vertical axis.

FIG. 15 is a graph illustrating the change over time of the electrical resistance value of the variable resistance film 12, with the operation time illustrated on the horizontal axis and the current illustrated on the vertical axis.

The effects of the memory device according to the embodiment illustrated in FIGS. 14A and 14B will now be described in comparison to the comparative example illustrated in FIGS. 4A and 4B.

In the memory device 3 according to the embodiment as illustrated in FIG. 14A, the filaments 16 are formed inside the variable resistance film 12 in only the regions directly under the two width direction end portions of the upper electrode 13 because the silver is segregated to the two width direction end portions inside the upper electrode 13. Therefore, the number of filaments formed in one memory cell is low; and the individual filaments are commensurately thick and tough. Therefore, the resistance value is low in the case where the filaments communicate between the upper and lower electrodes. In one example illustrated in FIG. 13B, the filaments 16 formed in each of the memory cells include one filament at each of the corner regions $R_P$ corresponding to the four corners of the region where the lower electrode 11 overlays the upper electrode 13, for a total of four filaments 16.

As a result, as illustrated in FIG. 14B, the switching operation stabilizes because the on/off ratio of the resistance value can be increased and a large hysteresis can be obtained in the switching operation. By thick filaments being formed, the filaments once formed are not easily decomposed by thermal decomposition; and the retention characteristics of the states improve.

Conversely, in the case where the silver is uniformly included inside the upper electrode 13 as illustrated in FIG. 4C, the filaments are formed in the entire square region inside the variable resistance film 12 where the lower electrode 11 overlays the upper electrode 13. Therefore, the number of filaments formed in one memory cell is high; and each of the filaments is commensurately fine and fragile. Therefore, the resistance value is relatively high even in the case where the filaments communicate between the upper and lower electrodes.

As a result, as illustrated in FIG. 4D, the switching operation is unstable because the on/off ratio of the resistance value decreases and the hysteresis of the switching operation decreases. Because the individual filaments are fine, thermal decomposition of the filaments undesirably occurs in a relatively short period of time; and the retention characteristics of the states are poor.

According to the simple model examined in the first embodiment, the life of the filaments is inversely proportional to the surface area of the region where the filaments can be formed. In other words, $\{1/\sqrt{(\text{surface area of region where filaments can be formed})}\} \propto \{1/\sqrt{(\text{number of filaments})}\} \propto \{\sqrt{(\text{cross-sectional area of filaments})}\} \propto (\text{radius of filaments}) = (\text{diffusion distance}) \propto \{\sqrt{(\text{life of filaments})}\}$.

In the comparative example illustrated in FIGS. 4C and 4D, the region where the filaments are formed is the square region where the upper electrode 13 overlays the lower electrode 11 as viewed from above and has a surface area of L×L. Conversely, in the embodiment illustrated in FIGS. 14A and 14B, the region where the filaments are formed is the rectangular region where the two width direction end portions of the upper electrode 13 overlay the lower electrode 11 and has a surface area of 2×0.2L×L if the silver is uniformly distributed in the rectangular region. Therefore, the embodiment has a surface area of the region where the filaments are formed that is 0.4 times that of the comparative example; and accordingly, the life of the filaments is 1/0.4=2.5 times that of the comparative example. In particular, in the case where the filaments 16 are formed only in the corner regions $R_P$ of the four locations where the two end portions of the lower electrode 11 overlay the two end portions of the upper electrode 13 as illustrated in FIG. 13B, the life of the filaments is 1/0.16=6.25 times because the total surface area of the corner regions $R_P$ of the four locations is 4×0.2L×0.2L=0.16L×L.

As illustrated in FIG. 15, a simulation of the change over time of the size of the current flowing between the lower electrode 11 and the upper electrode 13 was performed by applying a constant reading voltage to a memory cell which was in the low resistance state by forming the filaments inside the variable resistance film 12. As a result, although the current decreased over time for both the memory cell of the embodiment and the memory cell of the comparative example, the change of the current was more gradual for the memory device according to the embodiment than for the memory device according to the comparative example. It is estimated that this is because the filaments vanish less easily in the embodiment than in the comparative example.

Thus, according to the embodiment illustrated in FIGS. 14A and 14B, the state retention characteristics are better than those of the comparative example illustrated in FIGS. 4C and 4D.

The effects of the positions of the maximum values of the silver concentration being less than 0.2L from the two width direction ends of the upper electrode 13, respectively, will now be described.

As described above, the upper electrode 13 is patterned into an interconnect configuration extending in the second direction. Generally, when the potential is applied to the interconnect, the electric field is stronger at the two width direction end portions than at the width direction central portion of the interconnect because the electric field concentrates at the edge portions of the interconnect. Therefore, a stronger electric field is applicable to the silver ions and the filaments can be formed more effectively by causing the silver which is the ion source metal to be segregated to the two width direction end portions of the interconnect. Thereby, the filaments become tough; and the state retention characteristics of the memory cell improve.

Generally, the current substantially does not flow at the two width direction end portions of the interconnect because a roughness is unavoidably formed in the side surfaces of the interconnect and the electrons have inelastic scattering at the interconnect surfaces. In other words, the width direction central portion of the interconnect is the substantial current path. Therefore, by disposing the positions where the silver concentration has maximum values at the two width direction end portions of the interconnect, the electric field is applied to the filaments 16 but the current does not flow easily in the filaments 16 when the voltage is applied between the interconnects, that is, between the lower electrode 11 and the upper electrode 13. As a result, the filaments 16 do not decompose easily; and the state retention characteristics of the memory cell improve even more.

The size of the roughness of the side surfaces of the upper electrode 13 is, for example, about 2 to 3 nm for the total of both side surfaces. On the other hand, it is desirable for the interconnect width L of the upper electrode 13 to be downscaled to not more than 20 nm. In such a case, because L=20 nm and 0.2L=4 nm, the effect of suppressing the current flowing in the filaments 16 described above can be obtained by the positions $X_{max}$ being less than 0.2L from the two width direction ends of the upper electrode 13, respectively. This effect is particularly large in the case where the width of the upper electrode 13 is not more than 20 nm.

Otherwise, the configuration, the manufacturing method, the operations, and the effects of the embodiment are similar to those of the first embodiment described above.

For example, the effects of the maximum values $C_{max1}$ and $C_{max2}$ of the concentration of the ion source metal of the upper electrode 13 being not less than $1 \times 10^{22}$ atoms/cm$^3$ are as described with reference to FIG. 6 to FIG. 9 in the first embodiment.

The favorable combination of the ion source metal and the matrix material is as described with reference to FIGS. 10A and 10B in the first embodiment.

As in the second embodiment (referring to FIG. 11) described above, integration is possible in a cross-point structure in the memory device 3 according to the embodiment.

Although an example is illustrated in the embodiment and in the first embodiment described above in which the silver which is the ion source metal is segregated to the two width direction end portions of the upper electrode 13, the silver may be segregated only to one end portion of the two width direction end portions of the upper electrode 13. Thereby, the region where the filaments are formed can be narrower; the number of the filaments can be reduced; and each of the filaments can be tough. As a result, the retention characteristics of the states of the memory cell improve even more.

According to the third embodiment described above, a memory device having good retention characteristics of the states can be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory device, comprising:
   a first electrode;
   a second electrode; and
   a variable resistance film connected between the first electrode and the second electrode,
   the first electrode including a metal contained in a matrix made of a conductive material, a cohesive energy of the metal being lower than a cohesive energy of the conductive material,
   a concentration of the metal at a central portion of the first electrode in a width direction of the first electrode being higher than concentrations of the metal in two end portions of the first electrode in the width direction.

2. The device according to claim 1, wherein a concentration profile of the metal in the width direction of the first electrode has a maximum value at the central portion in the width direction.

3. The device according to claim 2, wherein the maximum value is not less than $1 \times 10^{22}$ atoms/cm$^3$.

4. The device according to claim 2, wherein distances from a position of the maximum value of the concentration profile to two ends of the first electrode in the width direction are not less than 0.2 times a width of the first electrode.

5. The device according to claim 1, wherein the first electrode is an interconnect extending in a first direction, and the second electrode is an interconnect extending in a second direction crossing the first direction.

6. The device according to claim 1, wherein the metal is at least one type of material selected from the group consisting of lithium, chrome, iron, copper, indium, tellurium, calcium, sodium, silver, cobalt, and gold.

7. The device according to claim 1, wherein the conductive material is at least one type of material selected from the group consisting of silicon, tungsten, molybdenum, titanium, chrome, tantalum, and nickel.

8. The device according to claim 1, wherein the variable resistance film includes at least one type of material selected from the group consisting of silicon, silicon oxide, aluminum oxide, hafnium oxide, tantalum oxide, molybdenum oxide, nickel oxide, titanium oxide, niobium oxide, tungsten oxide, germanium sulfide, copper sulfide, chromium sulfide, silver sulfide, titanium sulfide, tungsten sulfide, nickel sulfide, tantalum sulfide, molybdenum sulfide, zinc sulfide, a germanium-selenium compound, a germanium-tellurium compound, a germanium-antimony-tellurium compound, and an arsenic-tellurium-germanium-silicon compound.

9. A memory device, comprising:
   a first electrode;
   a second electrode; and
   a variable resistance film connected between the first electrode and the second electrode,
   the first electrode including silver contained in a matrix made of silicon,
   a concentration of the silver at a central portion of the first electrode in a width direction of the first electrode being higher than concentrations of the silver in two end portions of the first electrode in the width direction.

10. The device according to claim 9, wherein a concentration profile of the silver in the width direction of the first electrode has a maximum value at the central portion in the width direction.

11. The device according to claim 10, wherein the maximum value is not less than $1 \times 10^{22}$ atoms/cm$^3$.

12. The device according to claim 10, wherein distances from a position of the maximum value of the concentration profile to two ends of the first electrode in the width direction are not less than 0.2 times a width of the first electrode.

13. The device according to claim 9, wherein the first electrode is an interconnect extending in a first direction, and the second electrode is an interconnect extending in a second direction crossing the first direction.

14. The device according to claim 9, wherein the variable resistance film includes at least one type of material selected from the group consisting of silicon and silicon oxide.

15. A memory device, comprising:
   a first electrode;
   a second electrode; and
   a variable resistance film connected between the first electrode and the second electrode,
   the first electrode including a metal contained in a matrix made of a conductive material, a cohesive energy of the metal being lower than a cohesive energy of the conductive material,
   a concentration of the metal at two end portions of the first electrode in a width direction of the first electrode being higher than a concentration of the metal at a central portion of the first electrode in the width direction.

16. The device according to claim 15, wherein a concentration profile of the metal in the width direction of the first electrode has maximum values at the two end portions of the first electrode in the width direction, and the concentration profile at the central portion in the width direction is less than both of the maximum values.

17. The device according to claim 16, wherein the maximum values are not less than $1 \times 10^{22}$ atoms/cm$^3$.

18. The device according to claim 16, wherein distances from positions of the maximum values of the concentration profile to two ends of the first electrode in the width direction respectively are less than 0.2 times a width of the first electrode.

* * * * *